United States Patent
Lilic et al.

(10) Patent No.: US 11,329,554 B2
(45) Date of Patent: May 10, 2022

(54) CHARGE PUMP CIRCUIT ARRANGEMENT

(71) Applicant: ams AG, Premstätten (AT)

(72) Inventors: Nenad Lilic, Eindhoven (NL); Robert Kappel, Eindhoven (NL); Georg Röhrer, Eindhoven (NL)

(73) Assignee: AMS AG, Premstätten (AT)

( * ) Notice: Subject to any disclaimer, the term of this patent is extended or adjusted under 35 U.S.C. 154(b) by 44 days.

(21) Appl. No.: 17/055,903

(22) PCT Filed: Apr. 5, 2019

(86) PCT No.: PCT/EP2019/058694
§ 371 (c)(1),
(2) Date: Nov. 16, 2020

(87) PCT Pub. No.: WO2019/219295
PCT Pub. Date: Nov. 21, 2019

(65) Prior Publication Data
US 2021/0203221 A1 Jul. 1, 2021

(30) Foreign Application Priority Data
May 17, 2018 (EP) .................................. 18172965

(51) Int. Cl.
*H02M 3/07* (2006.01)
*H01L 27/092* (2006.01)
*H01L 29/94* (2006.01)

(52) U.S. Cl.
CPC ............ *H02M 3/07* (2013.01); *H01L 27/092* (2013.01); *H01L 29/94* (2013.01)

(58) Field of Classification Search
CPC ....... H02M 3/07; H02M 3/075; H01L 27/092; H01L 27/088; H01L 29/94; H01L 29/92; H01L 21/823493; G11C 5/145
See application file for complete search history.

(56) References Cited

U.S. PATENT DOCUMENTS 6,072,725 A 6/2000 Le et al.
6,914,791 B1 7/2005 Park et al.
(Continued)

FOREIGN PATENT DOCUMENTS

CN 102025358 A 4/2011
JP 2017131069 A 7/2017

OTHER PUBLICATIONS

Lauterbach et al. "Charge Sharing Concept and New Clocking Scheme for Power Efficiency and Electromagnetic Emission Improvement of Boosted Charge Pumps," IEEE Journal of Solid-State Circuits, vol. 35, No. 5, May 2000, 5 pages.
(Continued)

*Primary Examiner* — Sibin Chen
(74) *Attorney, Agent, or Firm* — MH2 Technology Law Group LLP

(57) ABSTRACT

A charge pump circuit arrangement includes a multitude of capacitors of a first and a second group controlled by non-overlapping clock pulses. The capacitors are partly realized in a semiconductor substrate including a deep well doping region and a high voltage doping region surrounded by the deep well doping region. Switches are connected to a pair of capacitors to control the deep well doping regions with signals in phase with the corresponding clock signal.

16 Claims, 5 Drawing Sheets

(56) References Cited

U.S. PATENT DOCUMENTS

| | | |
|---|---|---|
| 2003/0151449 A1 | 8/2003 | Nakagawa et al. |
| 2006/0119417 A1 | 6/2006 | Hsu et al. |
| 2009/0051413 A1 | 2/2009 | Chu et al. |
| 2010/0226166 A1 | 9/2010 | Jung et al. |
| 2010/0321099 A1 | 12/2010 | Hsieh et al. |
| 2012/0218032 A1* | 8/2012 | Nadimpalli .......... H02M 3/073 327/536 |
| 2013/0278317 A1 | 10/2013 | Iversen et al. |
| 2015/0091637 A1 | 4/2015 | Pan et al. |

OTHER PUBLICATIONS

Tsai et al. "A 1V Input, 3-to-6V Output, Integrated 58%-efficient Integrated Charge Pump with a Hybrid Topology for Area Reduction and an Improved Efficiency by Using Parasitics," IEEE Journal of Solid-State Circuits, vol. 50, No. 11, Nov. 2015, 16 pages.
International Search Report and Written Opinion in corresponding PCT Application No. PCT/EP2019/058694, dated Jun. 28, 2019, 12 pages.

* cited by examiner

CHARGE PUMP CIRCUIT ARRANGEMENT

The present application is the national stage entry of International Patent Application No. PCT/EP2019/058694, filed on Apr. 5, 2019, which claims benefit of priority of European Patent Application No. 18172965.8 filed on May 17, 2018, all of which are hereby incorporated by reference in their entirety for all purposes.

TECHNICAL FIELD

The present disclosure relates to a circuit arrangement for a charge pump. Specifically, the present disclosure relates to a charge pump circuit arrangement wherein a portion of a multitude of capacitors forming the charge pump is realized in the substrate that comprises a deep well doping region of a first conductivity type and another doping well of a second conductivity type disposed above the deep well region.

BACKGROUND

Charge pumps are widely used in integrated CMOS semiconductor circuits to generate an output voltage that is higher than the input supply voltage. In a Dickson type charge pump, a series of capacitors interconnected by switches are controlled by phase-shifted non-overlapping clock signals. The capacitors may be realized as MOS capacitors (MOSCAPs) wherein one portion of the capacitor is disposed in the semiconductor substrate and the other portion of the capacitor is formed by the gate electrode. Using complementary MOS technology (CMOS), a deep n-well doping region is disposed in a p-substrate. The deep n-well encloses a high voltage p-well which forms the lower plate of the charge pump capacitors. According to conventional CMOS structures, the deep n-well doping region is connected to a fixed voltage such as the supply voltage VDD. In this case, however, the parasitic capacitances between the lower plate of the charge pump capacitors and the deep n-well must be charged and discharged with every clock cycle. Since the parasitic capacitance between the high voltage p-well and the deep n-well is considerably large, the efficiency of the charge pump operation is limited.

SUMMARY

According to an embodiment, a charge pump circuit arrangement comprises a multitude of capacitors comprising a first group of capacitors and a second group of capacitors; the first group of capacitors coupled to a terminal for a first clock signal and the second group of capacitors coupled to a terminal for a second clock signal, the first and second clock signals having non-overlapping clock pulses; switches that connect one of the capacitors to another one of the capacitors; each one of the capacitors comprising a semiconductor substrate including a deep well doping region of a first conductivity type and a well doping region of a second conductivity type disposed adjacent to the deep well doping region of the first conductivity type, a portion of the capacitors disposed in the semiconductor substrate; the deep well doping regions of the first group of capacitors controlled by a first control signal that is in phase with the first clock signal and the deep well doping regions of the second group of capacitors controlled by a second control signal that is in phase with the second clock signal.

According to an aspect of the present disclosure, the deep n-wells of a triple well CMOS technology that are used to realize the MOSCAPs of the charge pump are driven by a voltage that is in phase with the clock signals that drive the corresponding MOSCAPs of the charge pump. Accordingly, the parasitic capacitance between the deep well doping region and the above-disposed high voltage well doping region of the complementary doping type requires less, or almost no, charging and discharging. At the same time, the parasitic capacitance between the deep well doping region and the semiconductor substrate is subject to periodic charging and discharging during the charge pump operation. However, this capacitance is smaller than the capacitance between the deep well doping region and the high voltage well doping region because the concentration of dopants in the substrate is relatively small so that the amount of charge needed to charge and discharge this parasitic capacitance is smaller than in a conventional circuit. As a result, the use of supply power is more efficient and the efficiency of the charge pump operation is increased.

The control signals driving the deep well doping regions are taken from a high voltage node of the charge pump capacitors. The voltages driving the deep well doping regions may be taken from two adjacent capacitors that supply the voltage in phase with the clock voltage of the capacitors. The voltages to control the deep well doping regions may be taken from those charge pump capacitors that are at the output end of the charge pump carrying the highermost voltages. Other capacitors in the sequence of capacitors are also possible. If the deep well clock signals are taken from the highermost capacitors, the efficiency increase may be most at the cost of a small amount of a potential ripple in the output voltage. If the deep well doping region control signals are taken from capacitors in the middle of the sequence of capacitors, the increase in efficiency may be lower, however, with the benefit of less or no additional ripple in the output voltage.

A switch circuit connected to the charge pump capacitors may supply the in phase control signal for the deep well doping regions. The switch circuit is controlled by the clock signals of the charge pump and comprises switch transistors to supply the in phase control signal to the deep well doping regions. A first one and a second one of switch circuits is required to supply a first and a second in phase control signal to the deep well doping regions. The switch circuits each comprise bootstrap capacitors and switch transistors to enable the switching of the high voltage to the deep well doping regions.

In an embodiment, the substrate may be a p-doped semiconductor substrate. The deep well doping region may be an n-doped deep well. The high voltage well doping region may be a high voltage p-doped well region enclosed by the n-doped deep well region. N-doped source and drain regions are disposed in the high voltage p-doped well to form one of the MOSCAP capacitors of the charge pump. The n-doped source/drain regions are connected with each other. A gate electrode disposed between the n-doped source/drain regions forms the upper plate of the MOSCAP capacitors of the charge pump.

The charge pump may comprise N capacitors disposed in a sequence, wherein a switch is provided between the 1st and the 2nd capacitor, the 2nd and the 3rd capacitor, etc. and between the N−1st capacitor and the N-th capacitor. The 1st capacitor is controlled by the first clock signal and the 2nd capacitor is controlled by the second clock signal, non-overlapping with the first clock signal, etc. so that the N−1st capacitor is controlled by the first clock signal and the N-th capacitor is controlled by the second non-overlapping clock signal. Consequently, the deep well doping regions of the 1st and the N−1st capacitors are controlled by a first control signal and the deep well regions of the 2nd and the N-th capacitor are controlled by a second control signal, wherein the first and second control signals are in phase with the first and second clock signals, however at elevated voltage level. The switch circuits that supply the first and second control signals to the deep well doping regions may be taken from the N−1st and the N-th capacitors.

Calculations and simulations show that the efficiency of the charge pump is increased since the parasitic capacitances that need to be charged and discharged during the charge pump operation are lower so that less power is needed and, consequently, the power dissipation is lower. On the other hand, it can be verified that the MOS capacitances of the charge pump may be dimensioned smaller in order to achieve the same efficiency as a conventional charge pump where the deep well doping regions are tied to a fixed potential. As a result, the area consumption of the integrated circuit is reduced.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
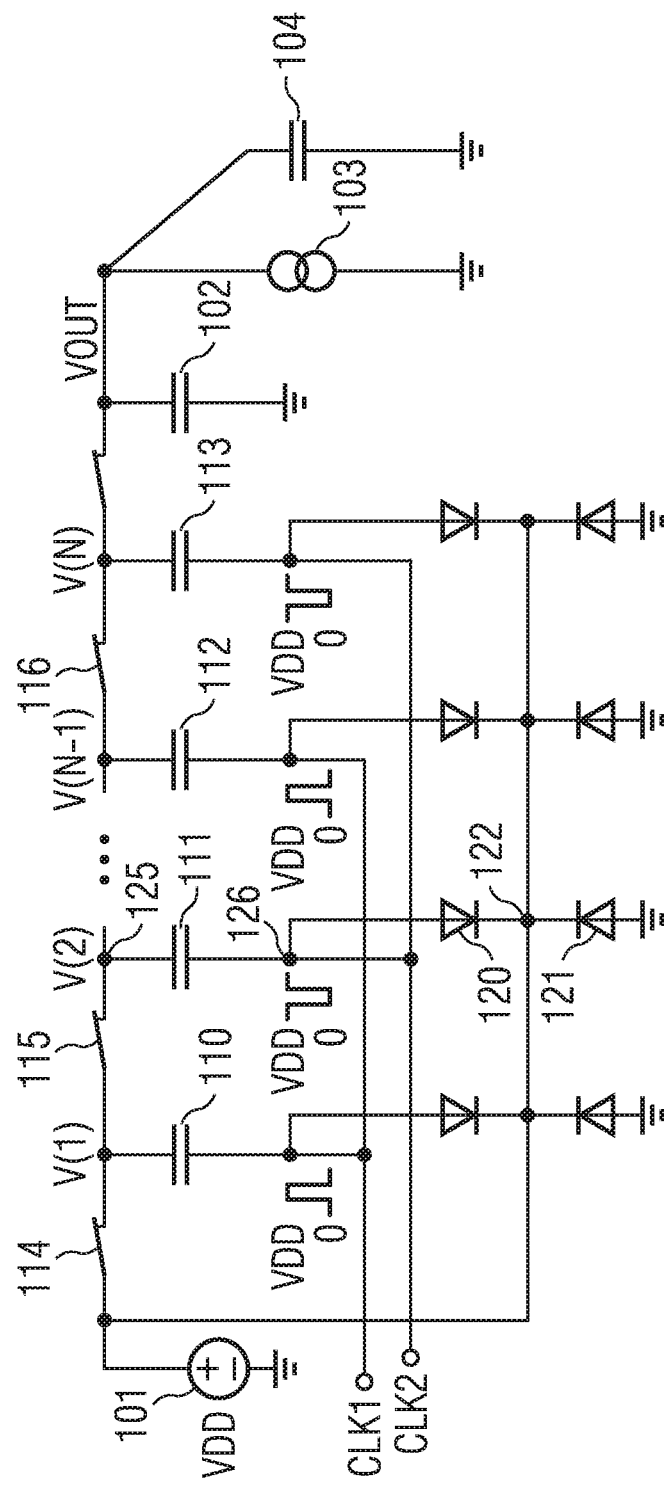
FIG. 1 shows a conventional charge pump circuit.

FIG. 1 shows a conventional charge pump circuit according to the so-called Dickson structure. The charge pump generates an elevated output voltage VOUT available at the tank capacitor 102 supplying the load 103, 104 from the input voltage VDD supplied by input voltage source 101. According to the Dickson structure, the charge pump comprises a sequence of a multitude of N capacitors of which capacitors 110, 111, 112, 113 are depicted in FIG. 1. Adjacent capacitors such as 110, 111 are connected through a switch 115 which may be a diode. The first capacitor 110 of the sequence of capacitors is connected through diode 114 to voltage supply 101. The uppermost capacitors 112, 113 are connected through switch or diode 116. The capacitors of a first group of capacitors such as capacitors 110, 112 are driven by a first clock signal CLK1. The capacitors of a second group of capacitors such as capacitors 111, 113 are controlled by a second clock signal CLK2, wherein clock signal CLK1 and CLK2 have phase shifted, non-overlapping pulses. The first and second group of capacitors are interleaved with each other. During the operation of the charge pump, in a first cycle, one of the capacitors is connected across the supply voltage to be charged. In a second cycle, the capacitor is reconfigured to be in series with the adjacently connected capacitor to input its load to that capacitor.

The capacitors 110, . . . , 113 can be realized as MOS capacitors (MOSCAPs) in a CMOS circuit technology so that one portion of the capacitor is realized in a well doping region of the substrate close to a gate electrode. The substrate includes also a deep well doping region below the well doping region to form the CMOS structure. For example, the terminal 126 connected to the lower plate of capacitor 111 is connected to parasitic capacitors 120, 121. The node 122 between parasitic capacitors 120, 121 is connected to the positive supply potential VDD according to conventional CMOS technology.

Figure 2:
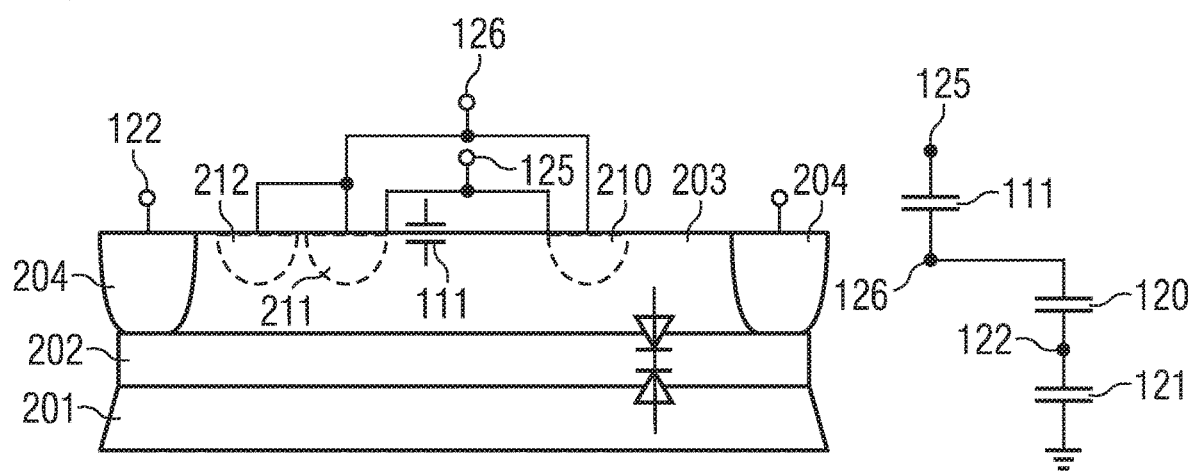
FIG. 2 shows a cross-section through a semiconductor substrate including a charge pump capacitor and illustrating the parasitic capacitances.

Turning now to FIG. 2, a CMOS layer representation of capacitor 111 is shown in more detail. FIG. 2 shows a triple well CMOS structure. A p-substrate 201 includes a deep n-well region 202. The deep n-well 202 is connected to high voltage (HV) n-well regions 204 to be accessible at terminal 122 at the surface of the substrate. Deep n-well region 202 encloses a high voltage p-well region 203 in which the capacitor 111 is realized, wherein high voltage p-well region 203 is disposed adjacent to or above deep n-well region 202. The lower plate of capacitor 111 is disposed in HV p-well region 203 and the top electrode of capacitor 111 is represented by a CMOS gate electrode. HV p-well region 203 includes $n^+$-doping regions 210, 211 to which the bottom electrode 126 of capacitor 111 is connected. HV p-well region 203 includes also a $p^+$-doping region 212 which is connected to the capacitor bottom electrode 126. A common deep well doping region and a common HV well doping region are associated to the first group of capacitors and another common deep well doping region and another HV well doping region are associated to the second group of capacitors.

A parasitic capacitance 120 is formed between HV p-well region 203 and deep n-well region 202. Another parasitic capacitance 121 is formed between p-substrate 201 and deep n-well region 202. Provided that deep n-well region 202 is connected to supply potential VDD at terminal 122 (FIG. 1), the parasitic capacitance 120 is charged and discharged at every clock cycle of the clock signal CLK2. The parasitic capacitance formed between the HV p-well and deep n-well regions driven by clock signal CLK1 are also charged and discharged at every clock cycle of clock signal CLK1. A schematic diagram of the CMOS layer representation of capacitor 101 is also depicted in the right-hand portion of FIG. 2 showing charge pump capacitor 111 and parasitic capacitances 120, 121 and the terminals/nodes 125, 126, 122.

Figure 3:
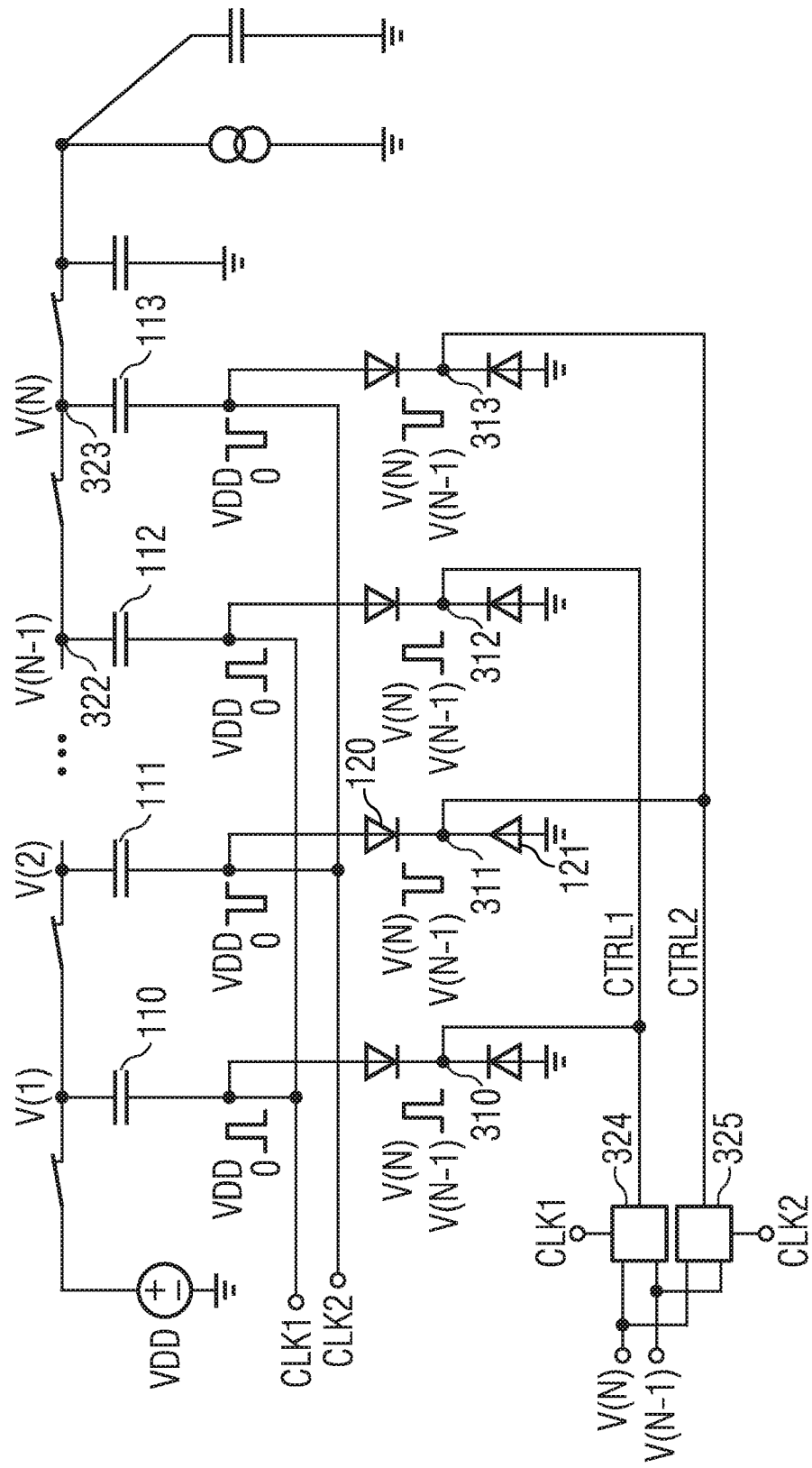
FIG. 3 shows a charge pump circuit according to the principles of this disclosure.

Turning now to FIG. 3, a charge pump of the Dickson architecture is shown according to the principles of the present disclosure. In contrast to the conventional charge pump of FIG. 1, the deep n-well node is controlled by a control signal that is in phase with one of the clock signals CLK1 and CLK2. The nodes 310, 312 of the first group of capacitors 110, 112 are connected to a switch circuit 324. The nodes 311, 313 of the second group of capacitors 111, 113 are controlled by a switch circuit 325. The switch circuits 324, 325 apply one of the voltages V(N) or V(N−1) to the nodes 310, 312 and 311, 313. Switch circuits 324, 325 are controlled by the corresponding clock signals CLK1 and CLK2. The nodes 310, . . . , 313 are controlled with a signal in phase to the clock signals. The capacitors 110, 112 are controlled by clock signal CLK1 so that also the switch 324 is controlled by a signal in phase with clock signal CLK1. Correspondingly, the capacitors 111, 113 are controlled by clock signal CLK2 and the corresponding switch 325 is also controlled by a signal in phase with clock signal CLK2.

The deep n-well region node 311 coupled to charge pump capacitor 111 is supplied with a pulse that is in phase with clock signal CLK2. While the bottom plate of capacitor 111 is supplied with a pulse from clock signal CLK2, deep n-well node 311 is supplied with voltage V(N) in phase with clock signal CLK2 through switch circuit 325. As a result, the parasitic capacitance of the diode composed of the HV p-well region and the deep n-well region is substantially not subjected to a charging or discharging operation because the bottom plate of capacitor 111 and the node 311 are driven with in phase signals. Instead, the parasitic capacitance of the diode 121 composed of the deep n-well region and the p-substrate is subjected to a charging/discharging operation. It is to be noted that the parasitic capacitance of diode 121 is smaller than the parasitic capacitance of diode 120, because the amount of doping in the p-substrate is low so that the parasitic capacitance of diode 121 is lower than the parasitic capacitance of diode 120. The amount of charge needed for the charging and discharging operation of parasitic capacitance 121 of the circuit of FIG. 3 is lower when compared to the parasitic capacitance 120 of the circuit of FIG. 1. A corresponding situation applies also to the nodes at the other charge pump capacitors 110, 112, 113. This increases the efficiency of the charge pump of FIG. 3, explained in more detail herein below.

The capacitors of the first group 110, 112 are disposed in a common deep n-well doping region and a common HV p-well doping region. Correspondingly, the capacitors of the second group 111, 113 are disposed in a common deep n-well doping region and a common HV p-well doping region. The common deep n-well doping region of the first group of capacitors is controlled by control signal CTRL1 and the common deep n-well doping region of the second group of capacitors is controlled by control signal CTRL2.

Figure 4:
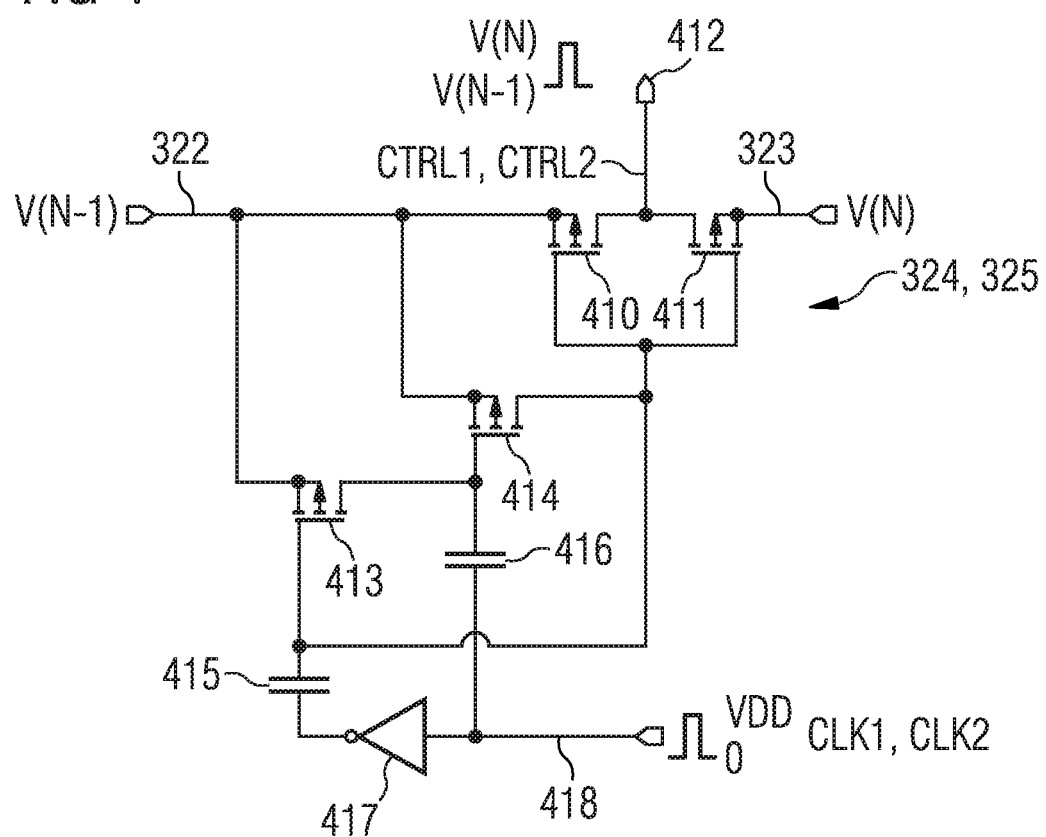
FIG. 4 shows a switch circuit useful for providing the in phase control signals for the deep well doping regions.

Turning now to FIG. 4, a schematic circuit representation for the switches 324, 325 is shown. Switch 324 is controlled by clock signal CLK1 at terminal 418, switch 325 is controlled by clock signal CLK2. The output signal is supplied at terminal 412 which is connected to nodes 310, 312 in the case of switch 324 or nodes 311, 313 in the case of switch 325. In more detail, the switch circuits 324, 325 each include a series connection of the drain source paths of MOS transistors 410, 411. The transistors 410, 411 are connected to two adjacent charge pump capacitors, for example, to the top plates 322, 323 of the two highermost charge pump capacitors 112, 113. The terminals 322, 323, in this case, are connected to capacitors 112, 113 so that they are supplied with the potentials V(N−1) and V(N). N-channel MOS transistors 413, 414 are connected to the source of n-channel transistor 410. The drain of transistor 413 is connected to the gate of transistor 414. The gates of transistors 413, 414 are connected to a corresponding bootstrap capacitor 415, 416 that are connected to the output of an inverter 417 and the input of the inverter 417, respectively. The inverter 417 is connected to terminal 418 that is supplied with the clock signal CLK1 or CLK2. The bootstrap capacitor 415 is also connected to the gates of transistors 410, 411. The function of the circuit of FIG. 4 is summarized in the table below:

| Clock phase of CLK1, CLK2 | 0 | VDD |
|---|---|---|
| Transistor 410 | ON | OFF |
| Transistor 411 | OFF | ON |
| Transistor 413 | ON | OFF |
| Transistor 414 | OFF | ON |
| Voltage at gates of transistors 410, 411 | V(N − 1) + VDD | V(N − 1) |
| Voltage at gate of transistor 414 | V(N − 1) | V(N − 1) + VDD |
| Voltage at terminal 412 | V(N − 1) | V(N) |

The table shows that the voltage at terminal 412 is either V(N−1) or V(N) in response to the level of the clock signals CLK1, CLK2 at terminal 418 so that the output voltages V(N−1) and V(N) are supplied in phase with clock signals CLK1, CLK2, respectively.

While FIG. 4 shows that the input voltage to the switch circuits 324, 325 is taken from the upper most charge pump capacitors 112, 113 at terminals 322, 323, it is also possible to take the input voltage of the switch circuits 324, 325 from another pair of adjacent transistors such as transistors V(x−1), V(x) with x=1, . . . , N. Using the voltage from the highermost capacitors such as 112, 113 achieves the highest increase in efficiency. However, this may cause a certain amount of ripple in the output voltage. Using the input voltage to the switches 324, 325 from another pair of charge pump capacitors may reduce the efficiency increase, however, may also reduce the ripple in the output voltage.

Figure 5:
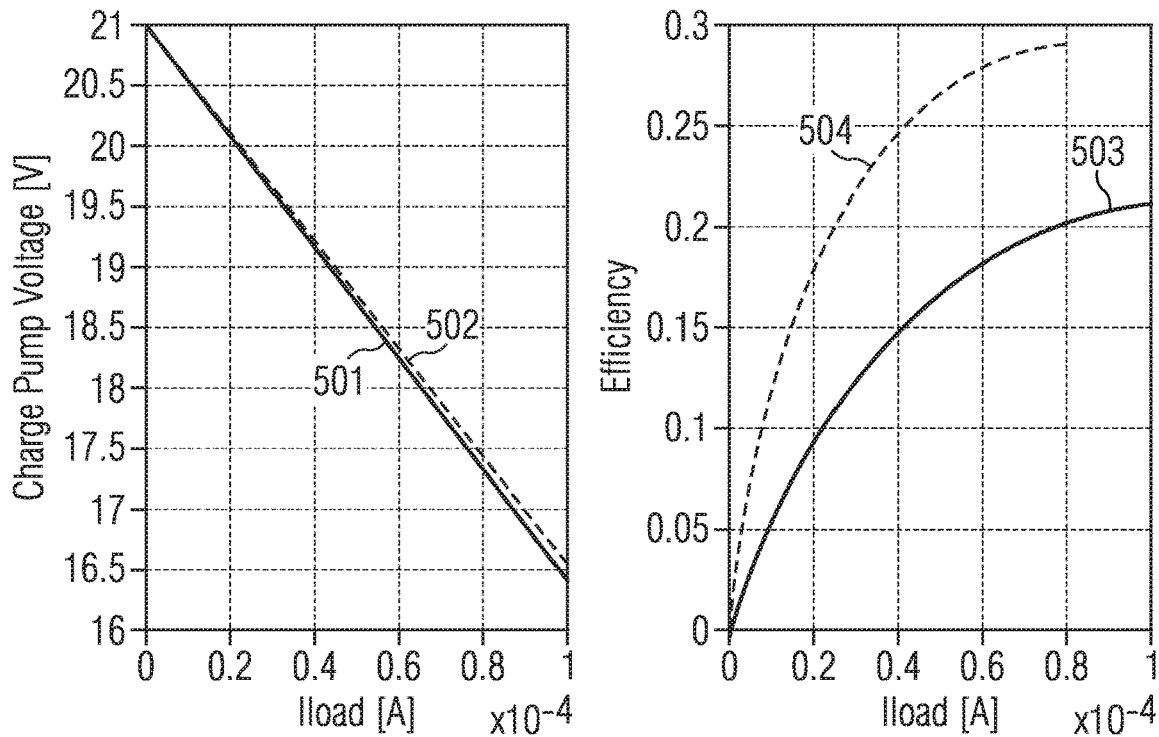
FIG. 5 shows a graph illustrating the output voltage and the efficiency according to an analytical model representing the charge pump circuits of FIG. 1 and FIG. 3.

FIG. 5 shows two charts related to the efficiency of a charge pump. The efficiency is considered as:

$$\text{Efficiency} = \frac{P_{OUT}}{P_{IN}} = \frac{V_{OUT} * I_{load}}{I_{VDD} * V_{DD}}$$

The efficiency has been calculated for the conventional charge pump of FIG. 1 and the charge pump according to the principles of the present disclosure of FIG. 3. Curves 501 and 502 show the output voltage of the charge pump over the output load current. Curve 501 relates to the circuit of FIG. 1, curve 502 relates to the circuit of FIG. 3. It can be concluded that the situation at the load is substantially the same for conventional and present charge pumps because curves 501, 502 are substantially the same. Turning now to the right-hand portion of FIG. 5, curve 503 represents the efficiency of the circuit of FIG. 1 and curve 504 represents the efficiency of the circuit of FIG. 3. As can be gathered from FIG. 5, the efficiency of the present circuit of FIG. 3 is substantially higher than the efficiency of the conventional circuit of FIG. 1, since curve 504 is substantially above curve 503. The present circuit of FIG. 3 requires less input power when compared to the conventional circuit of FIG. 1. On the other hand, it can be concluded that the power dissipation of the circuit of FIG. 3 is less than the circuit of FIG. 1 having the same output load conditions.

Figure 6:
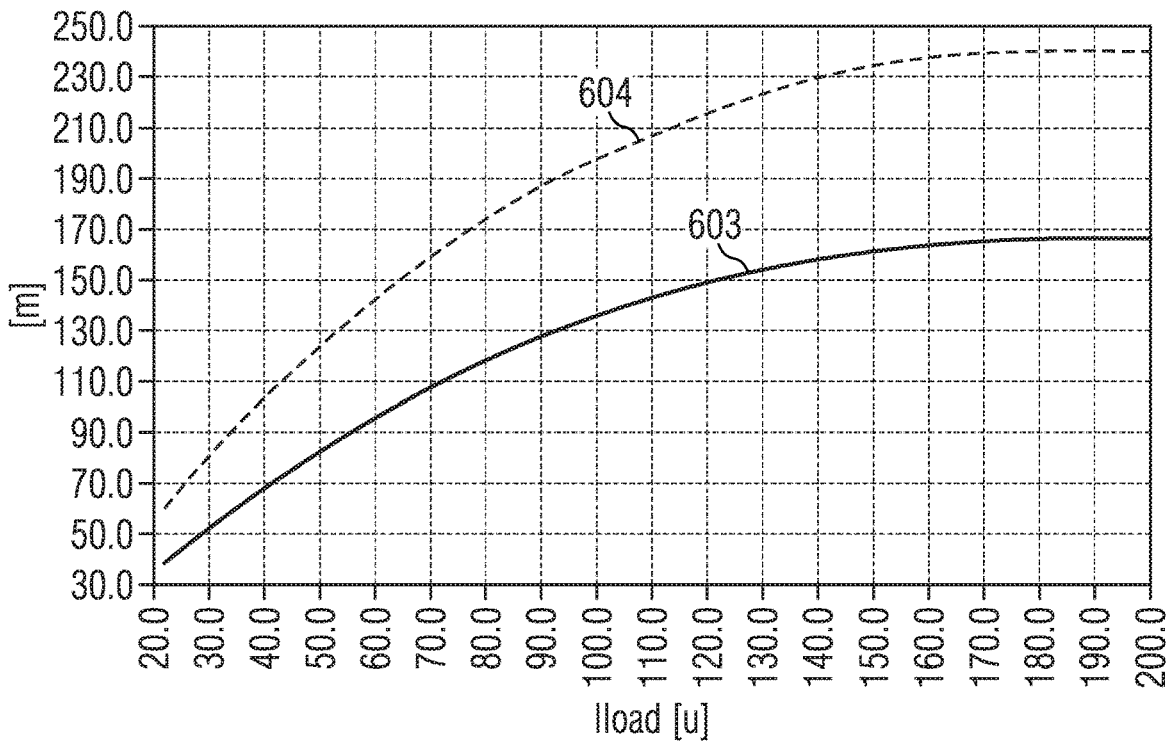
FIG. 6 shows a simulation of the charge pump output voltage using a circuit simulation tool for the charge pump circuits of FIGS. 1 and 3.

FIG. 6 shows the simulation of the efficiency of the conventional and the present charge pumps with the simulation programs of Cadence™. Curve 603 depicts the efficiency for the circuit of FIG. 1 and curve 604 depicts the efficiency of the circuit of FIG. 3. As can be gathered from FIG. 6, the efficiency of the present circuit of FIG. 3 is substantially higher than the efficiency of the circuit of FIG. 1, since curve 604 is substantially above curve 603.

Additional simulations reveal that size and number of MOSCAP capacitors can be varied to optimize semiconductor area consumption. In an example, increasing the number of capacitors from the conventional to the present approach from 6 to 7 capacitors and reducing the size of the capacitors by a factor of 0.7, the saving of area for the realization of the MOSCAP capacitors is about 18% while achieving more efficiency at about the same power conditions at the output of the charge pumps. This result is achieved in that the present charge pump of FIG. 3 renders more efficiency in that the deep n-well node is controlled with a voltage from higher order capacitors in phase with the corresponding clock signals.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirt and substance of the disclosure may occur to the persons skilled in the art, the disclosure should be construed to include everything within the scope of the appended claims.

We claim:

1. A charge pump circuit arrangement, comprising:
   a multitude of capacitors comprising a first group of capacitors and a second group of capacitors;
   the first group of capacitors coupled to a terminal for a first clock signal and the second group of capacitors coupled to a terminal for a second clock signal, the first and second clock signals having non-overlapping clock pulses;
   switches that connect one of the capacitors to another one of the capacitors;
   each one of the capacitors comprising a semiconductor substrate including a deep well doping region of a first conductivity type and a well doping region of a second conductivity type disposed adjacent to the deep well doping region of the first conductivity type, a portion of the capacitors disposed in the semiconductor substrate;
   the deep well doping regions of the first group of capacitors controlled by a first control signal that is in phase with the first clock signal and the deep well doping regions of the second group of capacitors controlled by a second control signal that is in phase with the second clock signal.

2. The charge pump circuit arrangement of claim 1, wherein the first and second control signals are supplied from a node coupled to another portion of one of the capacitors of the first group and from another node coupled to another portion of one of the capacitors of the second group.

3. The charge pump circuit arrangement of claim 2, wherein the node and the other node are connected to the other capacitor portions of adjacent capacitors connected to one of the switches.

4. The charge pump circuit arrangement of claim 3, wherein the capacitors are disposed in a sequence, the sequence comprising a first capacitor connected to a terminal for a supply voltage and a last capacitor connected to a terminal for an output voltage having a voltage higher than the supply voltage, wherein the other node is coupled to the last capacitor and the node is coupled to the capacitor connected to the last capacitor through one of the switches.

5. The charge pump circuit arrangement of claim 1, wherein the deep well doping regions of the capacitors of the first group are coupled to a switch circuit that is controlled by the first clock signal and that is connected to adjacent capacitors of the sequence of capacitors and the deep well doping regions of the second group of capacitors are coupled to another switch circuit that is controlled by the second clock signal and that is connected to said adjacent capacitors.

6. The charge pump circuit arrangement of claim 5, wherein the switch circuit and the other switch circuit each comprise:
   a terminal for one of the first and second clock signals,
   a series connection of complementary MOS transistors connected to one of the capacitors of the first group and one of the capacitors of the second group.

7. The charge pump circuit arrangement of claim 6, wherein the switch circuit and the other switch circuit each further comprise:
   an inverter connected to the terminal for one of the first and second clock signals;
   a first switch transistor connected to one of the complementary MOS transistors and the gate terminals of the complementary MOS transistors and a second switch transistor connected to the one of the complementary MOS transistors and the gate terminal of the first switch transistor;
   a bootstrap capacitor connected to the terminal for one of the first and second clock signals and to the gate terminal of the second switch transistor;
   another bootstrap capacitor connected to the output of the inverter and to the gate terminal of the first switch transistor.

8. The charge pump circuit arrangement claim 5, wherein one of the adjacent capacitors is connected to a terminal for an output voltage higher than a supply voltage.

9. The charge pump circuit arrangement of claim 1, wherein the capacitors are MOS capacitors comprising a first plate disposed in one of the well doping regions, a second plate forming a gate electrode disposed above the first plate and doping regions of the first conductivity type disposed in the well doping regions adjacent to the gate electrodes.

10. The charge pump circuit arrangement of claim 1, wherein each one of the capacitors comprises a semiconductor substrate of a second conductivity type which includes a deep well doping region of a first conductivity type opposite the second conductivity type and a well doping region of the second conductivity type disposed adjacent to the deep well doping region of the first conductivity type, wherein a portion of the capacitors is disposed in the well doping region of the second conductivity type.

11. The charge pump circuit arrangement of claim 1, wherein the first conductivity type is n-doped and the second conductivity type is p-doped.

12. The charge pump circuit arrangement of claim 1, wherein the deep well doping regions of the first group of capacitors form a common first deep well doping region of the first conductivity type and the well doping regions of the first group of capacitors form a common first well doping region of the second conductivity type and wherein the deep well doping regions of the second group of capacitors form a common second deep well doping region of the first conductivity type and the well doping regions of the second group of capacitors form a common second well doping region of the second conductivity type.

13. The charge pump circuit arrangement of claim 1, comprising:
- a p-doped substrate;
- a n-doped deep well doping region disposed in the substrate, the n-doped deep well doping region enclosing a corresponding p-doped well doping region disposed in the substrate;
- n-doped regions disposed in the p-doped well doping regions, the n-doped regions short-circuited with each other;
- gate electrodes disposed between adjacent ones of the n-doped regions, wherein the n-doped regions and the gate electrode form a corresponding MOS capacitor.

14. The charge pump circuit arrangement of claim 1, comprising a sequence of N capacitors of which:
- a 1st capacitor is connected to a terminal for a supply voltage;
- a 2nd capacitor is connected to the first capacitor by a switch;
- a N−1st capacitor is connected to a N-th capacitor by a switch; and
- the N-th capacitor is connected to a terminal for an elevated output voltage,
- wherein the 1st and the N−1st capacitors are controlled by the first clock signal, the 2nd and the N-th capacitors are controlled by the second clock signal, the deep well doping regions of the 1st and N−1st capacitors are controlled by the first control signal and the deep well doping regions of the 2nd and the N-th capacitor are controlled by the second control signal.

15. The charge pump circuit arrangement of claim 14, further comprising:
- a switch circuit connected to the N−1st and the N-th capacitor and having a terminal for the first clock signal, the switch circuit configured to generate the first control signal; and
- another switch circuit connected to the N−1st and the N-th capacitor and having a terminal for the second clock signal, the switch circuit configured to generate the second control signal.

16. The charge pump circuit arrangement of claim 1, wherein the deep well doping regions of the capacitors of the first group are coupled to a switch circuit that is controlled by the first clock signal and that is connected to one of the capacitors of the first group and one of the capacitors of the second group and the deep well doping regions of the second group of capacitors are coupled to another switch circuit that is controlled by the second clock signal and that is connected to the one of the capacitors of the first group and the one of the capacitors of the second group and wherein the switch circuit and the other switch circuit each comprise a terminal for one of the first and second clock signals and a series connection of complementary MOS transistors connected to the one of the capacitors of the first group and the one of the capacitors of the second group.

* * * * *